(12) United States Patent
Dettmann

(10) Patent No.: US 6,825,717 B2
(45) Date of Patent: Nov. 30, 2004

(54) FEEDBACK NETWORK AND AMPLIFIER AND/OR CONVERTER CIRCUIT WITH A FEEDBACK NETWORK

(75) Inventor: Ingo Dettmann, Stuttgart (DE)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/393,152

(22) Filed: Mar. 20, 2003

(65) Prior Publication Data

US 2004/0183592 A1 Sep. 23, 2004

(51) Int. Cl.[7] .................................................. H03F 1/36
(52) U.S. Cl. ........................ 330/86; 330/144; 324/115
(58) Field of Search ..................... 330/86, 144; 324/115

(56) References Cited

U.S. PATENT DOCUMENTS 3,539,936 A * 11/1970 McGhee ....................... 330/86
4,105,967 A * 8/1978 Macemon ..................... 330/86

FOREIGN PATENT DOCUMENTS

JP          9229770        * 9/1997

OTHER PUBLICATIONS

Milman "Microelectronics" McGraw–Hill Book Co 1979, p. 754.*

* cited by examiner

Primary Examiner—Michael B Shingleton

(57) ABSTRACT

A feedback network for connecting an output of an operational amplifier with a feedback input of the operational amplifier, wherein the feedback network comprises a feedback circuit. The feedback network comprises a semiconductor switch in series to the feedback circuit for turning off and on the feedback network.

15 Claims, 4 Drawing Sheets

FEEDBACK NETWORK AND AMPLIFIER AND/OR CONVERTER CIRCUIT WITH A FEEDBACK NETWORK

FIELD OF THE INVENTION

The present invention relates to a feedback network for connecting an output of an operational amplifier with a feedback input of said operational amplifier, wherein said feedback network comprises a feedback circuit.

The present invention further relates to an amplifier and/or converter circuit comprising at least one operational amplifier that comprises a feedback network for connecting an output of said operational amplifier with a feedback input of said operational amplifier, wherein said feedback network comprises a feedback circuit.

Within prior art it is well known to use operational amplifiers in a so-called closed-loop mode with a feedback network of the above mentioned type. For instance, such operational amplifiers are used as current-to-voltage converters within power meters, input stages of optical receivers and the like.

To enhance a measurement range of an input stage of an operational amplifier, it is known to provide several feedback networks which can selectively be activated and which are usually connected in parallel with each other so as to alter a resulting feedback network impedance. Activation is performed by mechanical switches such as relays, which has several disadvantages such as size, limited lifetime of relay contacts and switching speed.

SUMMARY OF THE INVENTION

It is an object of the present invention to provide an improved feedback network and an amplifier and/or converter circuit with a feedback network without the above mentioned disadvantages of prior art systems.

According to the present invention, this object is achieved by providing a semiconductor switch in series to said feedback circuit of said feedback network. Such a semiconductor switch has a very short switching time and semiconductor lifetime usually exceeds the lifetime of a mechanical relay. Apart from that, a semiconductor switch is very small and may directly be integrated on an operation amplifier's substrate which reduces costs.

According to an advantageous embodiment of the present invention, the semiconductor switch is a field-effect transistor, which can be controlled by a control voltage and does not require a substantial control current such as mechanical relays.

A further variant of the present invention suggests that a source electrode of said field-effect transistor is connected to said feedback input of said operational amplifier, and that a drain electrode of said field-effect transistor is connected to said feedback circuit. The feedback circuit or the whole feedback network, respectively, can thus advantageously be turned on and/or off by controlling a gate electrode of said field-effect transistor.

A bulk electrode of the field-effect transistor is advantageously coupled such that a leakage current at the bulk electrode is not fed in .o said feedback network.

To prevent leakage currents through the source electrode of the field-effect transistor, for example, a bulk electrode of said field-effect transistor is assigned the same potential as said source electrode. However, in some configurations of the operational amplifier such as basic inverting configurations, said feedback input constitutes a so-called virtual ground terminal. Consequently, said bulk electrode may not be connected to said source electrode and hence to said feedback input directly, but it must rather be connected to a real ground terminal.

According to a further very advantageous embodiment of the present invention, a correction voltage terminal is provided between said semiconductor switch and said feedback circuit. This allows for assessing a voltage drop across the semiconductor switch that affects a feedback voltage fed back to said feedback input of said operational amplifier.

From said correction voltage terminal, within a further embodiment of the invention, a correction voltage is obtained with which an output voltage of said operational amplifier can be corrected. To eliminate the non-linear influence of said voltage drop across the semiconductor switch on said output voltage, said correction voltage is subtracted from said output voltage.

A further variant of the invention provides a photodiode connected to said feedback input of said operational amplifier which enables to process optical signals.

As a further solution to the object of the present invention, an amplifier and/or converter circuit is presented which comprises at least one operational amplifier that comprises a feedback network for connecting an output of said operational amplifier with a feedback input of said operational amplifier, wherein said feedback network comprises a feedback circuit and a semiconductor switch in series to said feedback circuit.

Within a very advantageous embodiment of said amplifier and/or converter, said operational amplifier(s) comprise(s) a plurality of said feedback networks according to the present invention which are connected in parallel to each other. With this configuration, it is possible to simultaneously turn on and/or turn off, i.e. select an arbitrary number of feedback networks thus altering a resulting feedback network impedance between said output of said operational amplifier and said feedback input. Changing the feedback network impedance influences a gain factor of said amplifier/converter and thus contributes to an enhancement of a measurement range of said amplifier.

Yet another advantageous variant of the invention is characterized by a subtractor circuit for subtracting said correction voltage from said output voltage of said operational amplifier. Said subtractor circuit may be implemented as an operational amplifier in subtractor configuration.

The feedback network and the amplifier and/or converter given by the present invention is particularly well-suited for an input stage of an optical power meter and for controlling and enhancing, respectively, a measurement range of said input stage. Generally, the amplifier/converter according to the present invention is ideally suited for applications which require a processing of input signals with a high dynamic range.

BRIEF DESCRIPTION OF THE DRAWINGS

Further advantages and features of the present invention are presented in the following detailed description with reference to the drawings, wherein.

DETAILED DESCRIPTION OF THE PREFERRED EMBODIMENT

Figure 1:
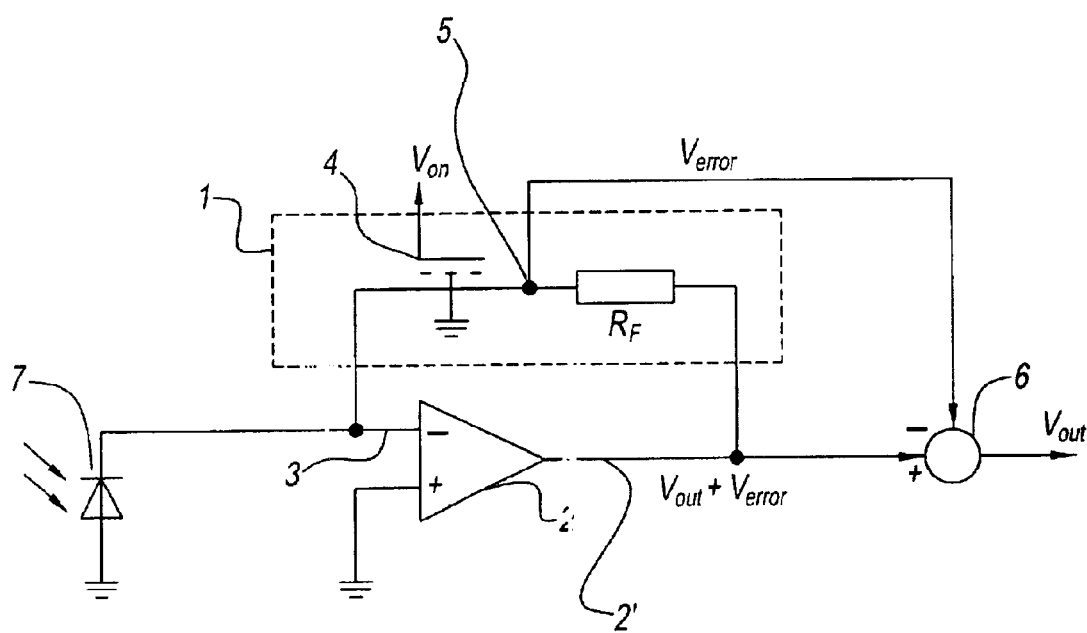
FIG. 1 shows an operational amplifier 2 with a feedback network 1 according to a first embodiment of the present invention.

FIG. 1 shows an operational amplifier 2 that is configured as current-to-voltage converter with its non-inverting input '+' connected to ground. An inverting input '−' of said operational amplifier 2, which in the further description will be referred to as feedback input 3, receives an input current (not shown) from a photodiode 7 which is converted by said operational amplifier 2 to an output voltage $V_{out}+V_{error}$ at its output 2'. Said feedback input 3 is also connected to a terminal of a feedback network 1, which is indicated by a dashed rectangle in FIG. 1.

Said feedback network 1 comprises a semiconductor switch in form of a field-effect transistor 4, and furthermore, said feedback network 1 comprises a feedback circuit $R_F$ in series to said field-effect transistor 4. Said feedback network 1 connects said output 2' of said operational amplifier 2 with said feedback input 3 of said operational amplifier 2.

Figure 2:
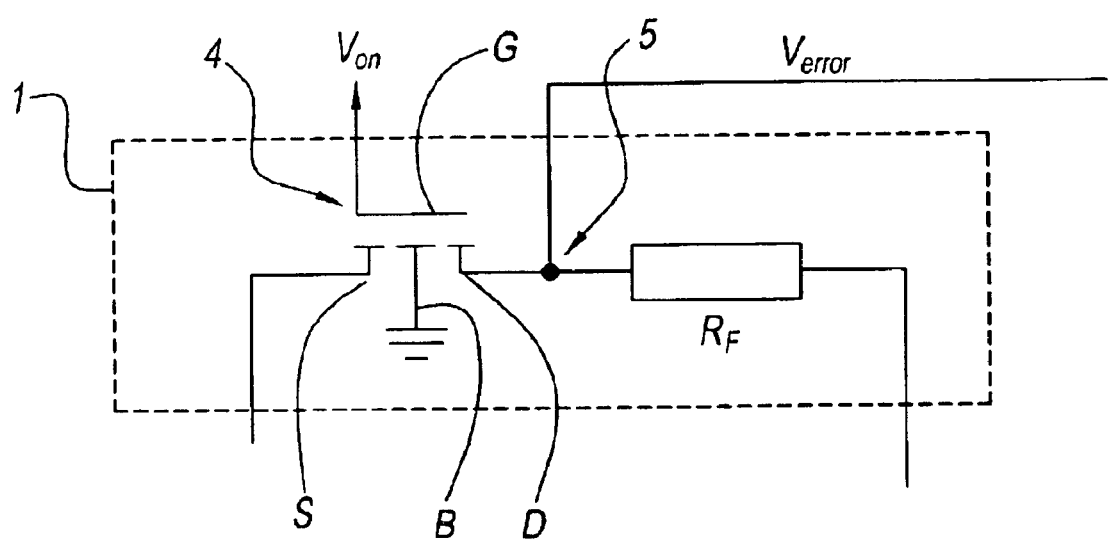
FIG. 2 shows in magnification the feedback network 1 section of FIG. 1.

As can be seen in FIG. 2, a source electrode S of said field-effect transistor 4 constitutes the above mentioned terminal of said feedback network 1, which is connected to said feedback input 3 of said operational amplifier 2 (FIG. 1). A drain electrode D of said field-effect transistor 4 is connected to said feedback circuit $R_F$. The drain-source resistance between said drain electrode D and said source electrode S of said field-effect transistor 4 can be controlled by applying a corresponding control voltage $V_{on}$ to a gate electrode G of said field-effect transistor 4, and thus said field-effect transistor 4 can be used as a switch that can be turned off/turned on depending on said control voltage $V_{on}$. Accordingly, said feedback network 1 can selectively be connected to said feedback input 3 of said operational amplifier 2.

For instance, if said gate electrode G of said field-effect transistor 4 is controlled such that the drain-source resistance is very high, i.e. in the MOhm ($10^6$ Ohm) range, said feedback network 1 is considered to be turned off, i.e. it does not contribute to a feedback impedance between said output 2' of said operational amplifier 2 and said feedback input 3 of said operational amplifier 2. On the other hand, if said gate electrode G of said field-effect transistor 4 is controlled such that the drain-source resistance is very low, said feedback network 1 is considered to be turned on, i.e. it does contribute to a feedback impedance between said output 2' of said operational amplifier 2 and said feedback input 3 of said operational amplifier 2.

As can be seen from FIG. 2, a bulk electrode B of said field-effect transistor 4 is connected to ground. Since in the present configuration, said feedback input 3 (FIG. 1) of said operational amplifier 2 represents a so-called "virtual ground" terminal, said bulk electrode B (FIG. 2) and said source electrode S of said field-effect transistor 4 are assigned the same potential, which reduces leakage currents through the source electrode S of said field-effect transistor 4. However, since said feedback input 3 of said operational amplifier 2 is only a virtual ground terminal, said bulk electrode B of said field-effect transistor 4 must not be connected to said source electrode S or said feedback input 3 of said operational amplifier 2 directly.

Said feedback network 1 comprises a correction voltage terminal 5, which is situated at a node between said field-effect transistor 4, more precisely said drain electrode D of said field-effect transistor 4, and said feedback circuit $R_F$.

Said correction voltage terminal 5 allows for assessing a voltage drop across said field-effect transistor 4, which is due to a non-zero drain-source resistance of said field-effect transistor 4 if said field-effect transistor 4 is turned on and a drain-source current is flowing. Said voltage drop across said field-effect transistor 4 induces a non-linear characteristic in the feedback mechanism of said feedback network 1, because the voltage drop depends on the drain-source current.

To eliminate the non-linear behavior which is caused by said voltage drop across said field-effect transistor 4, a correction voltage $V_{error}$ is obtained from said correction voltage terminal 5. Said correction voltage $V_{error}$ is subtracted by means of a subtractor circuit 6 (FIG. 1) from the output voltage $V_{out}+V_{error}$ of said operational amplifier 2. In consequence, at the output of said subtractor circuit 6, a corrected output voltage $V_{out}$ is obtained. This corrected output voltage $V_{out}$ does not depend on said drain-source current.

Hence, with said correction voltage terminal 5 according to the present invention, it is possible to correct a non-linear behavior that is caused by using a semiconductor switch, such as said field-effect transistor 4 for turning on/turning off said feedback network 1. Though a field-effect transistor 4 is ideally suited for said switching process, other types of semiconductor switches may be employed for turning on/off said feedback network 1 as well.

Another source of non-linear influence to said output voltage $V_{out}+V_{error}$ is e.g. a drain-source resistance which depends on temperature. This temperature dependency as well as further similar effects can also be eliminated regarding said output voltage $V_{out}+V_{error}$ by applying the aforementioned measures.

Figure 3:
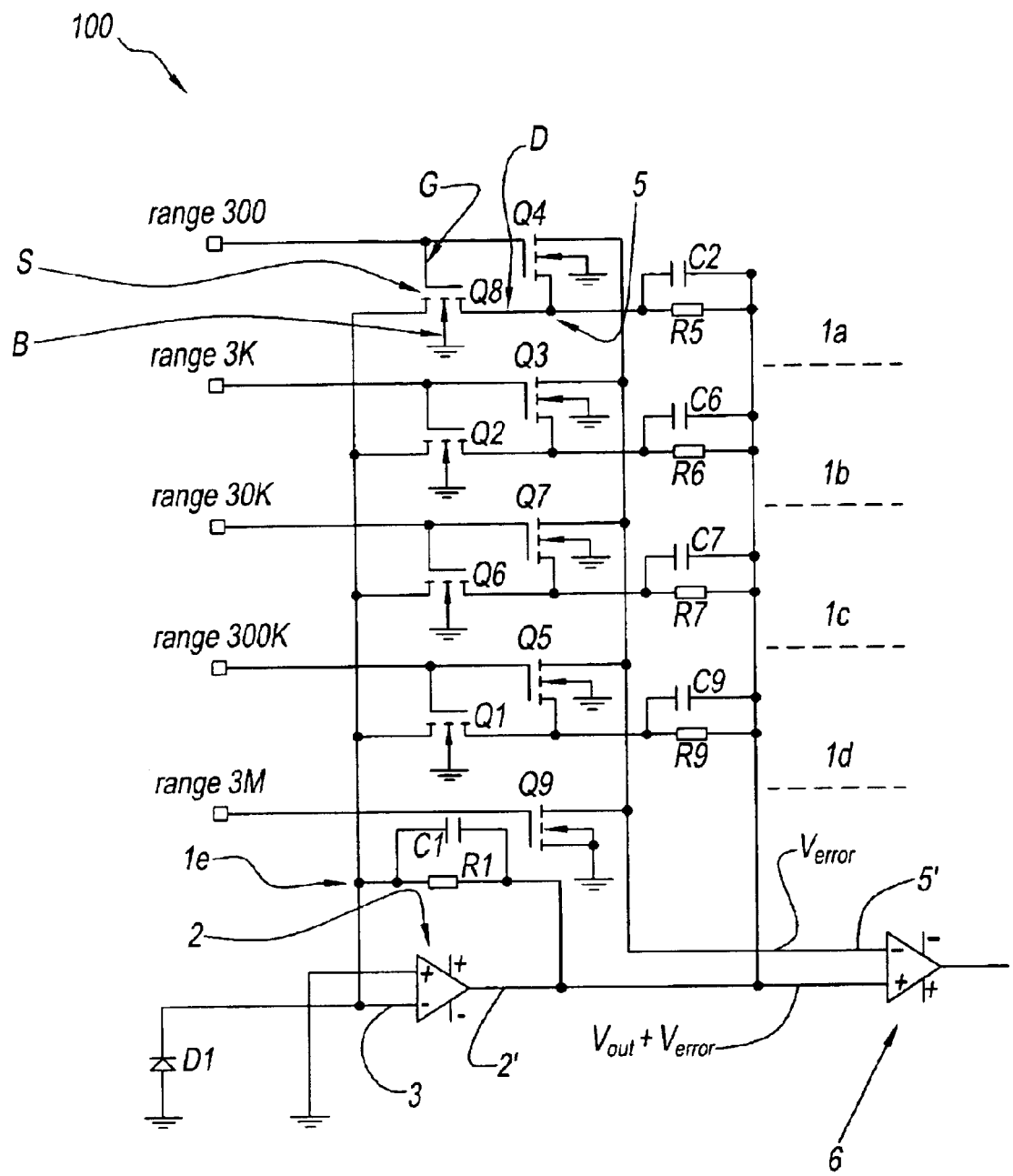
FIG. 3 shows a second embodiment of the present invention.

A further embodiment of the present invention is shown in FIG. 3, which represents an amplifier and converter circuit 100. In analogy to the preceding embodiment of the invention shown in FIG. 1 and FIG. 2, said amplifier 100 of FIG. 3 also comprises an operational amplifier 2, which is configured as a current-to-voltage converter receiving an input current at its feedback input 3 from a photodiode D1. Correspondingly, at said output 2' of said operational amplifier 2, an output voltage $V_{out}+V_{error}$ is obtained.

In contrast to the preceding embodiment of the invention, said amplifier 100 comprises a plurality of feedback networks 1a, 1b, 1c, 1d and 1e. The dashed lines on the right of FIG. 3 together with said numerals 1a to 1d designate schematic portions of said amplifier 100 each belonging to another of several cascaded feedback networks 1a to 1d. For example, (electronic) parts of said amplifier 100 which are above the dashed line between numerals 1a and 1b, form a first feedback network 1a, and so on. A basic feedback network 1e is designated by the corresponding arrow in FIG. 3.

Each of the cascaded feedback networks 1a to 1d consists of two field-effect transistors and a feedback circuit. E. g., said first feedback network 1a of said amplifier 100 is constituted by a resistor R5 in parallel to a capacitor C2, which forms a feedback circuit equivalent to said feedback circuit $R_F$ of said first feedback network 1 of FIG. 1. Furthermore, the field-effect transistors Q4 and Q8 are part of said first feedback network 1a.

The field-effect transistor Q8 represents a semiconductor switch with which said first feedback network 1a can be turned on and off, i.e. it corresponds to said field-effect transistor 4 of the first embodiment of the invention shown in FIG. 1. By turning on said field-effect transistor Q8, said first feedback network 1a can be connected in parallel to the basic feedback network 1e, which is fixedly connected between said output 2' and said feedback input 3 of said operational amplifier 2.

The basic feedback network 1e comprises a resistor R1 and a capacitor C1 and does not require a semiconductor switch because it permanently provides a basic feedback impedance for the operational amplifier 2, the basic impedance resulting from said resistor R1 and said capacitor C1.

Hence, by turning on said field-effect transistor Q8, an overall feedback impedance between said output 2' and said feedback input 3 depends on the resistors R5, R1 and on the capacitors C2 and C1. In contrast, by turning off said field-effect transistor Q8, said first feedback network 1a does not contribute to said overall feedback impedance which therefore is only determined by the resistor R1 and the capacitor C5.

Correspondingly, a gain factor of said operational amplifier 2 is influenced by altering said overall feedback impedance which can advantageously be employed for altering or enhancing a measurement range, respectively, of said amplifier 100.

As already discussed above, in analogy to the first embodiment of the invention, a source electrode S of said field-effect transistor Q8 is connected to said feedback input 3 of said operational amplifier 2. This holds true for the source electrodes of the remaining field-effect transistors Q2, Q6, Q1, too. Thus, it is possible to arbitrarily select one of said feedback networks 1a to 1d for being connected in parallel to said basic feedback network 1e by applying a respective control voltage to the respective control terminal.

In the present case, said control terminals are denoted as range_300, range_3k, range_30k, range_300K, range_3M, and each of these control terminals is connected to a gate electrode G (FIG. 2, 3) of the respective field-effect transistor Q8, Q2, Q6, Q1. Accordingly, a drain electrode D (FIG. 2, 3) of each of said field-effect transistors Q8, Q2, Q6, Q1 is connected to the respective feedback circuit. For example, the drain electrode D of said field-effect transistor Q6 is connected to a parallel circuit consisting of resistor R7 and capacitor C7, and so on.

In addition, field-effect transistors Q4, Q3, Q7, 05, Q9 are provided, which connect a control voltage terminal 5 to a respective input terminal 5' of a subtractor circuit 6, which is realized by a further operational amplifier in subtractor configuration. The respective gate electrodes of said field-effect transistors Q4, Q3, Q7, Q5, Q9 are also connected to said control terminals range_300, range_3k, range_30k, range_300K, range_3M depending on the feedback network they are assigned to. For example, said field-effect transistor Q4 which is assigned to said first feedback network 1a, has its gate electrode connected to said control terminal range_300.

As already explained with the first embodiment of the present invention (FIG. 1, 2), a correction voltage $V_{error}$ is obtained from said correction voltage terminal 5 and is supplied to said input 5' of said subtractor 6, where said output voltage $V_{out}+V_{error}$ is corrected to a corrected output voltage $V_{out}$.

If only the basic feedback network 1e is to be used, i.e. if said cascaded feedback networks 1a to 1d are turned off by appropriately applying the required control voltage to said control terminals range_300, range_3k, range_30k, range_300K, range_3M, the field-effect transistor Q9 is activated thus connecting said input terminal 5' of said subtractor circuit 6 to ground, because in this case no non-zero correction voltage is required since there is no voltage drop across a field-effect transistor within said basic feedback network 1e because said basic feedback network 1e has no semiconductor switch at all.

In analogy to the first embodiment of the present invention, each field-effect transistor of said amplifier 100 of FIG. 3 is connected to ground with its bulk electrode B so as to reduce leakage currents through the source electrode S. But only the bulk electrode B of the field-effect transistor Q9 may be connected to the corresponding grounded source electrode S directly, because said source electrode S itself is directly connected to ground, as can be seen from FIG. 3.

The source electrodes of the remaining field-effect transistors Q4, Q8, Q3, Q2, Q7, Q6, Q5, Q1 are connected to a virtual ground terminal of said operational amplifier 2. Consequently, the bulk electrodes of said remaining field-effect transistors Q4, 08, Q3, Q2, Q7, Q6, Q5, Q1 must not be connected directly to said source electrodes but they are assigned the same potential by grounding them separately.

In summary, the amplifier 100 of FIG. 3 provides five different measurement ranges for an input signal received at said feedback input 3, each of which can be selected by applying a control voltage to the respective control terminal range_300, range_3k, range_30k, range_300K, range_3M.

Generally, the use of a correction voltage terminal according to the present invention is not limited to feedback networks with field-effect transistors 4. The correction voltage terminal may even be applied when using mechanical relays as switching devices for turning on/off said feedback networks.

Figure 4:
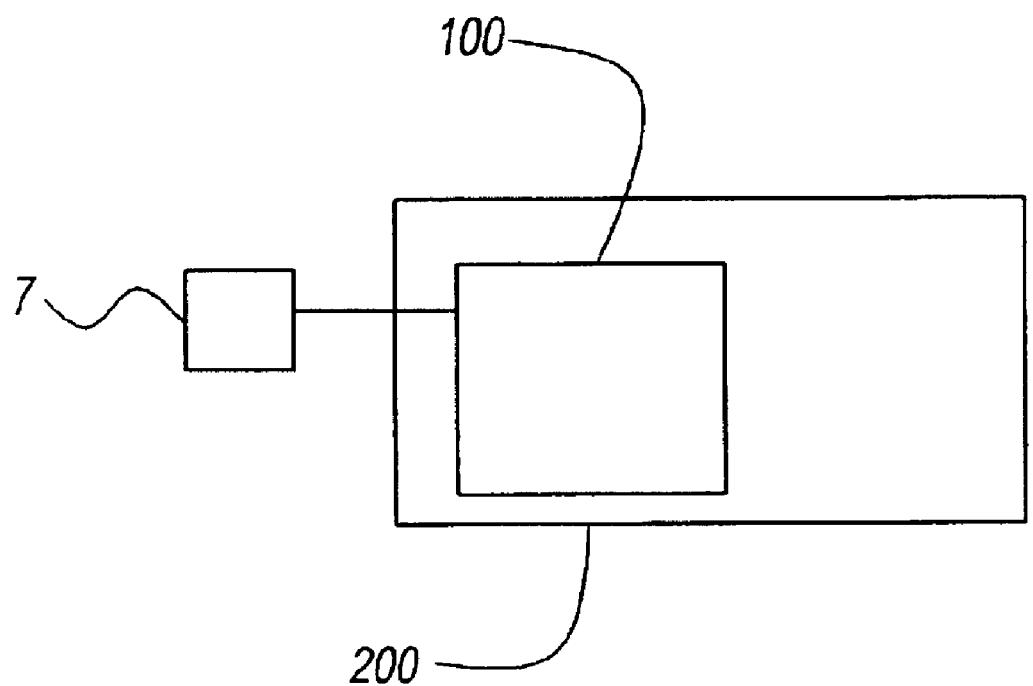
FIG. 4 shows an optical power meter according to the present invention.

A schematic representation of an optical power meter 200 according to the present invention is shown in FIG. 4. Said optical power meter 200 comprises the amplifier 100 of FIG. 3 and a photodiode 7, which is connected to said feedback input 3 (cf. FIG. 3) of said operational amplifier 2. According to the above explanations, said optical power meter 200 has five different measurement ranges for measuring an input signal received from said photodiode 7 at, said feedback input 3.

What is claimed is:

1. A feedback network for connecting an output of an operational amplifier with a feedback input of said operational amplifier, wherein said feedback network comprises a feedback circuit and a semiconductor switch in series to said feedback circuit, wherein a correction voltage terminal is provided between said semiconductor switch and said feedback circuit, and wherein an output voltage of said operational amplifier is corrected by using a correction voltage obtained from said correction voltage terminal.

2. A feedback network according to claim 1, wherein said semiconductor switch is a field-effect transistor.

3. A feedback network according to claim 2, wherein a source electrode of said field-effect transistor is connected to said feedback input of said operational amplifier, and wherein a drain electrode of said field-effect transistor is connected to said feedback circuit.

4. A feedback network according to claim 2, wherein said feedback network can be turned on and/or turned off by controlling a gate electrode of said field-effect transistor.

5. A feedback network according to claim 2, wherein a bulk electrode of said field-effect transistor is assigned the same potential as a source electrode of said field-effect transistor.

6. A feedback network according to claim 5, wherein said bulk electrode is coupled such that a leakage current at the bulk electrode is not fed into said feedback network.

7. A feedback network according to claim 1, wherein said correction voltage can be subtracted from said output voltage.

8. A feedback network according to claim 1, wherein a photodiode is connected to said feedback input of said operational amplifier.

9. An amplifier and/or converter circuit comprising:
at least one operational amplifier that comprises a feedback network for connecting an output of said operational amplifier with a feedback input of said operational amplifier, wherein said feedback network comprises a feedback circuit and a semiconductor switch in series to said feedback circuit, wherein a subtractor circuit is provided for subtracting a correction voltage from an output voltage of said operational amplifier.

10. Amplifier and/or converter circuit according to claim 9, wherein said operational amplifier comprises a plurality of feedback networks, said feedback networks being connected in parallel to each other.

11. Amplifier and/or converter circuit according to claim 9, wherein said feedback network can be selected by controlling said semiconductor switch.

12. Amplifier and/or converter circuit according to claim 9, wherein said feedback network comprises a feedback circuit and a semiconductor switch in series to said feedback circuit, and wherein said semiconductor switch is a field-effect transistor.

13. Amplifier and/or converter circuit according to claim 12, wherein a bulk electrode of said field-effect transistor is coupled such that a leakage current at the bulk electrode is not fed into a feedback network connected to said operational amplifier.

14. An optical power meter comprising an amplifier and/or converter circuit comprising:
at least one operational amplifier comprising a feedback network for connecting an output of said operational amplifier with a feedback input of said operational amplifier, wherein said feedback network comprises an arrangement selected from the group consisting of a feedback circuit and a semiconductor switch in series to said feedback circuit, a feedback network comprising a feedback circuit and a semiconductor switch in series to said feedback circuit, and any combinations thereof, wherein said arrangement is in particular for controlling and/or enhancing a measurement range of an input stage of the optical power meter.

15. Optical power meter according to claim 14, wherein a photodiode is connected to a feedback input of said operational amplifier.

* * * * *